United States Patent
Hasegawa

(10) Patent No.: US 6,735,088 B2
(45) Date of Patent: May 11, 2004

(54) CIRCUIT BOARD PROTECTION COVER AND CIRCUIT BOARD HAVING CIRCUIT BOARD PROTECTION COVER

(75) Inventor: Fumio Hasegawa, Tokyo (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 0 days.

(21) Appl. No.: 10/166,043

(22) Filed: Jun. 11, 2002

(65) Prior Publication Data
US 2002/0186550 A1 Dec. 12, 2002

(30) Foreign Application Priority Data
Jun. 12, 2001 (JP) .......................................... 2001-176537

(51) Int. Cl.⁷ ................................................ H05K 5/00
(52) U.S. Cl. ....................................... 361/752; 361/796
(58) Field of Search ................................. 361/800, 816, 361/818, 752, 754

(56) References Cited

U.S. PATENT DOCUMENTS

| | | | | | |
|---|---|---|---|---|---|
| 2,704,075 | A | * | 3/1955 | Cherkin ....................... | 604/408 |
| 3,496,969 | A | * | 2/1970 | Bruce et al. ................... | 141/20 |
| 4,919,955 | A | * | 4/1990 | Mitchell ...................... | 426/394 |
| 6,070,397 | A | * | 6/2000 | Bachhuber .................... | 53/512 |

* cited by examiner

Primary Examiner—David Martin
Assistant Examiner—Thanh S. Phan
(74) Attorney, Agent, or Firm—McGinn & Gibb, PLLC

(57) ABSTRACT

A circuit board protection cover includes a protection cover and an incision. The protection cover covers a circuit mounting surface of a circuit board entirely, and is made of an insulating material. The incision is selectively formed in the protection cover.

30 Claims, 3 Drawing Sheets

CIRCUIT BOARD PROTECTION COVER AND CIRCUIT BOARD HAVING CIRCUIT BOARD PROTECTION COVER

BACKGROUND OF THE INVENTION

The present invention relates to a circuit board protection cover and a circuit board having the circuit board protection cover and, more particularly, to the structure of a measuring/circuit adjusting opening formed in a protection cover that protects a circuit board.

A protection cover is sometimes provided to a circuit board, in accordance with the type of product to which the circuit board is to be mounted, in order to shield external dust or to prevent short-circuiting, or for the purpose of magnetic shielding. The inspection of checking whether the product functions correctly or the adjustment of an electrical circuit cannot be performed correctly unless assembly of components including the circuit board is completed. When the voltage waveform or voltage of the electrical circuit mounted on the circuit board is to be measured, measurement must be performed after removing the protection cover from the circuit board. This makes the operation cumbersome, which is not efficient.

In order to solve this, conventionally, as shown in FIG. 4A, a rectangular opening 221 is formed in a protection cover 220 to correspond to the position of a measurement pad 211 or circuit adjusting component 212 on a circuit board 210 which is to be measured or adjusted. As shown in FIG. 4B, a measurement probe 231 is inserted in the protection cover 220 through the opening 221 and is brought into contact with the measurement pad 211 or circuit adjusting component 212, thereby performing target measurement or circuit adjustment.

With the conventional protection cover structure, the circuit board 210 communicates with the outside through the opening 221 during non-measurement as well. Hence, dust or a foreign substance tends to enter the protection cover structure from the outside through the opening 221. Then, short-circuiting between wires may occur in the circuit board 210, leading to a defective electrical circuit.

Also, an electric field or magnetic field may leak from the circuit board 210 through the opening 221 to electrically adversely affect peripheral devices of the circuit board 210.

SUMMARY OF THE INVENTION

It is an object of the present invention to provide a circuit board protection cover for preventing dust or a foreign substance from entering from the outside and for preventing leakage of an electromagnetic wave to the outside, and a circuit board having the circuit board protection cover.

In order to achieve the above object, according to the present invention, there is provided a circuit board protection cover comprising a box-like body for covering a circuit mounting surface of a circuit board entirely and made of an insulating material, and an incision selectively formed in the box-like body.

DESCRIPTION OF THE PREFERRED EMBODIMENTS

The present invention will be described in detail with reference to the accompanying drawings.

Figure 1A:
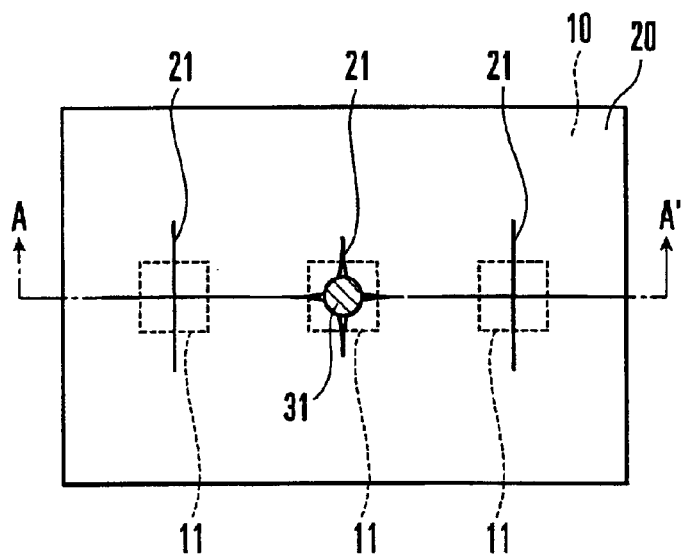
FIG. 1A is a plan view of a circuit board having a protection cover according to the first embodiment of the present invention.
Figure 1B:
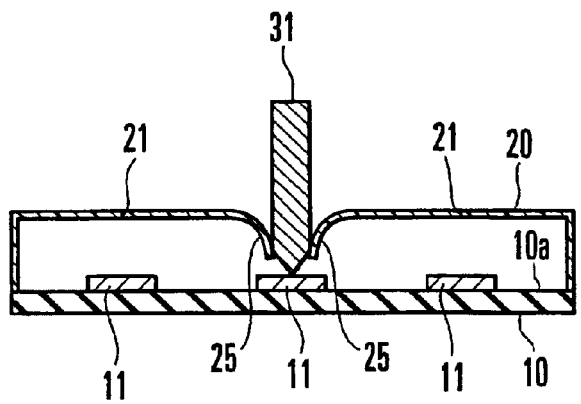
FIG. 1B is a sectional view taken along the line A–A' of FIG. 1B.

FIGS. 1A and 1B show a circuit board having a protection cover according to an embodiment of the present invention. In FIGS. 1A and 1B, a detailed interconnection on the circuit board is omitted, and only a portion related to the present invention is extracted and illustrated in enlargement to facilitate understanding.

Referring to FIG. 1A, a plurality of measurement pads 11 for voltage/signal waveform measurement or circuit adjusting components (not shown) are formed on the circuit mounting surface of a rectangular circuit board 10. A box-like protection cover 20 for protecting the circuit board 10 and made of an insulating material is attached to the circuit board 10. For example, the protection cover 20 is made of an elastic transparent plastic material with a thickness of about 0.3 mm to 0.5 mm. The protection cover 20 covers the circuit mounting surface (10a) of the circuit board 10 entirely through a space so dust or a foreign substance does not enter the circuit board 10 from the outside.

The protection cover 20 has crisscross incisions 21 at positions corresponding to the measurement pads 11 or circuit adjusting components. Four regions defined by each incision 21 form protection cover flexing portions 25. The distal ends of the protection cover flexing portions 25 are displaced in a direction perpendicular to the protection cover 20, i.e., in the inserting/pulling direction of a measurement probe 31 (to be described later), to open/close the incision 21. Except for measurement/adjustment, the incision 21 is closed not to form a gap, so it completely shields dust or a foreign substance entering from the outside.

The incision 21 can have various types of shapes other than a crisscross shape, for example, an asterisk, H, U, or Y shape. Any other arbitrary shape is also possible, as a matter of course.

Measurement operation for the circuit board 10 will be described. Upon start of the measurement operation, first, the measurement probe 31 is pushed into the incision 21 corresponding to the measurement pad 11 as the measurement target, and is moved down in the protection cover 20 while widening the incision 21. At this time, as the measurement probe 31 with a circular-conical distal end moves down, the protection cover flexing portions 25 adjacent to the incision 21 start to open gradually, and are opened most widely when the measurement probe 31 is in contact with the measurement pad 11, as shown in FIG. 1B.

The measurement probe 31 inserted in the protection cover 20 stops downward movement when it comes into contact with the measurement pad 11. While the measurement probe 31 is in contact with the measurement pad 11, the protection cover flexing portions 25 are kept pushed down and opened by the measurement probe 31.

When the measurement operation of the measurement probe 31 is ended, the measurement probe 31 separates from the measurement pads 11 to move up, and is pulled out from the incision 21. At this time, as the protection cover flexing portions 25 adjacent to the incision 21 have elasticity (restoring force), they are restored to the original closed state when the measurement probe 31 separates from the protection cover 20. This state is the same as that of the incision 21 before the measurement probe 31 is inserted.

According to this embodiment, since the incision 21 for allowing insertion of the measurement probe 31 into the protection cover 20 is formed, during non-measurement, the protection cover 20 can keep closed. Hence, dust or a foreign substance can be prevented from entering the circuit board 10 from the outside, and short-circuiting and leakage between wires of the circuit board 10 can be prevented.

As the protection cover 20 is formed of an elastic transparent plastic single layer, the state of the surface of the circuit board 10 can be seen from the outside through the protection cover 20, so measurement is not hindered.

Figure 2:
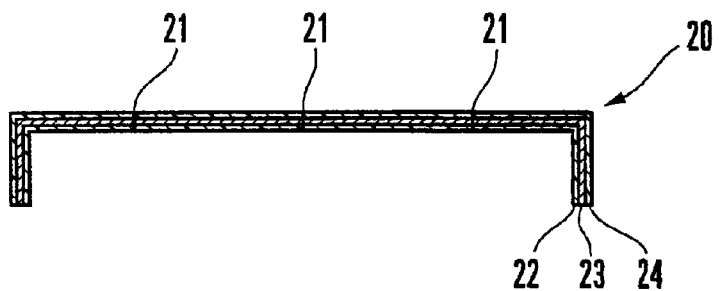
FIG. 2 is a longitudinal sectional view showing an example of the protection cover shown in FIG. 1A.

In order to prevent EMI (ElectroMagnetic Interference) from the circuit board 10 to the outside, as shown in FIG. 2, a metal thin film 23 made of either aluminum, chromium, silver, copper, or tin may be formed to a thickness of about 10 nm on the surface of a plastic box 22 which forms the protection cover 20, so the protection cover 20 has a high shielding function. When ITO (Indium Tin Oxide) is used to form the metal thin film 23, the metal thin film 23 can be formed to a thickness of 30 nm to 50 nm. When the metal thin film 23 has this thickness, the protection cover 20 becomes transparent or translucent, so a high measurement operation efficiency can be maintained in the same manner as with a protection cover 20 formed of a single plastic layer.

When the metal thin film 23 is to be formed on the plastic box 22, usually, a much thinner resin layer 24 (or a film laminate) is formed on the surface of the metal thin film 23 by coating, so deterioration of the metal thin film 23 is prevented. In this case, as shown in FIG. 2, incisions 21 are formed to extend through a protection cover 20 formed of the plastic box 22, metal thin film 23, and resin layer 24.

To manufacture a plastic mold body covered with the metal thin film 23 including the resin layer 24 as described above, the metal thin film 23 is formed on a flat plate-like plastic base film as the material of the protection cover 20, and after that the metal thin film 23 is coated with a much thinner resin layer 24. The resultant structure is then cut into a predetermined size, and is molded into a box by vacuum molding or press molding, thereby fabricating the protection cover 20.

As the EMI prevention protection cover 20, several types of commercially available films may be used, which are formed by depositing aluminum on polyethylene terephthalate (PET) films by vapor deposition and have light transmittances adjusted between 15% and 50%. A protection film is also attached to the surface of the aluminum film, so the characteristics as an insulating protection cover can be ensured.

Figure 4A:
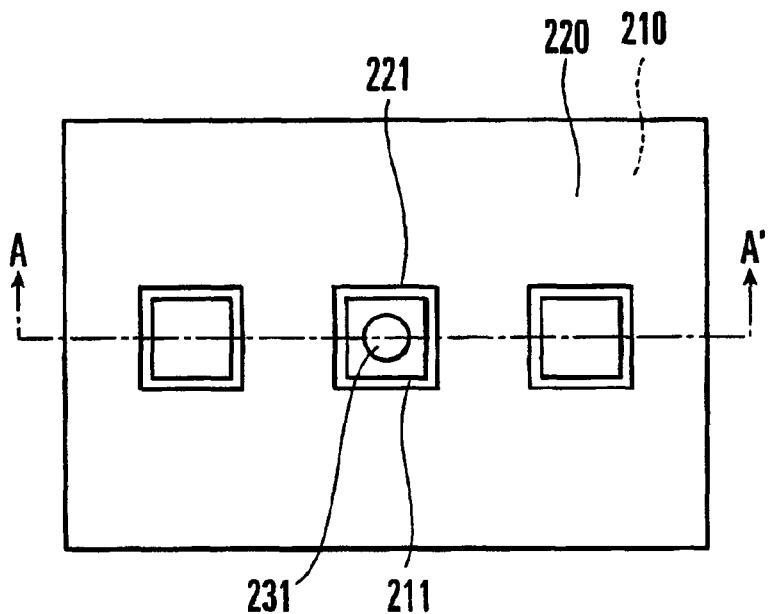
FIGS. 4A and 4B are plan and sectional views, respectively, of a circuit board having a conventional protection cover.
Figure 4B:
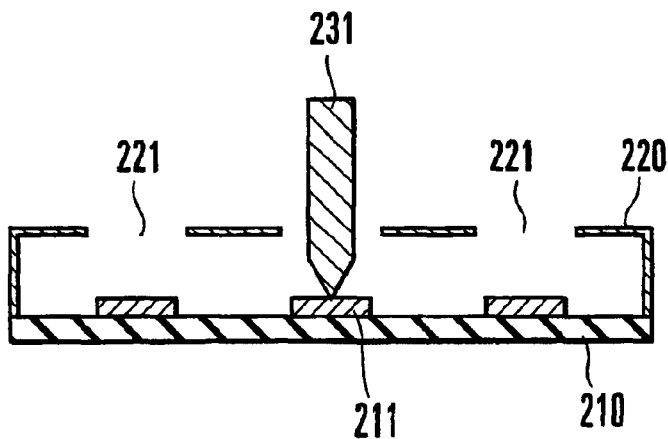

In the above embodiment, the protection cover 20 is entirely made of a plastic (and the metal thin film 23 including the resin layer 24 on it). The protection cover 20 need not be entirely made of a plastic, but may be made of a plastic only at the region of the incision 21 and protection cover flexing portions 25. For example, a plastic film may be adhered only to the region of the measuring/adjusting opening 221 (FIGS. 4A and 4B) of the conventional metal protection cover, and an incision 21 may be formed in the adhered plastic film. With this structure, the same effect as that of the above embodiment can be obtained.

Figure 3:
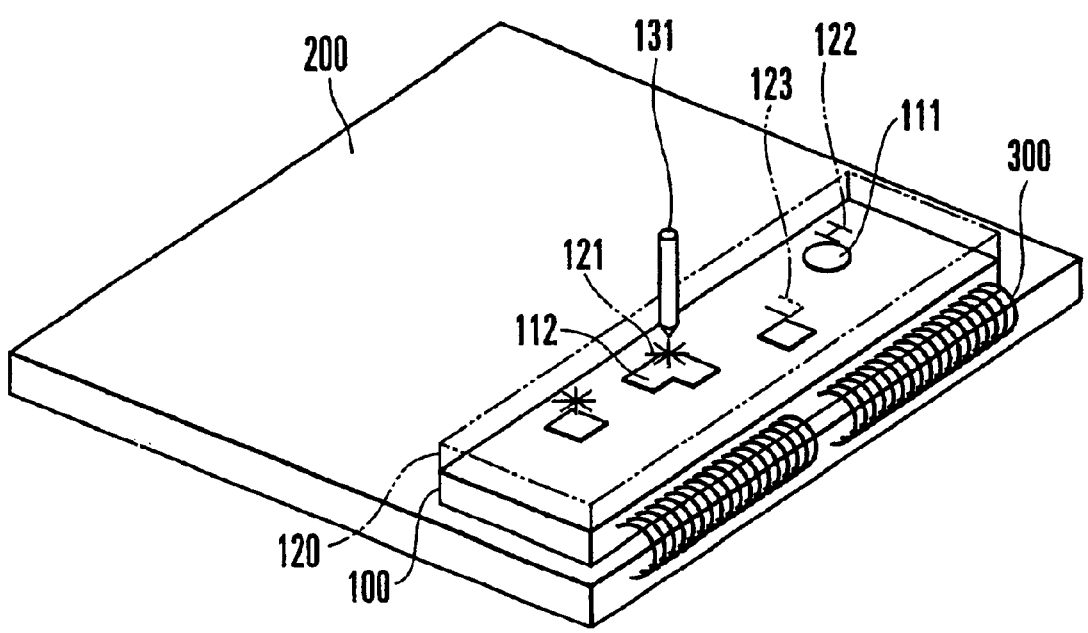
FIG. 3 is a perspective view of a liquid crystal display device according to the second embodiment of the present invention.

The second embodiment of the present invention will be described with reference to FIG. 3. In the second embodiment, a circuit board having a protection cove according to the first embodiment is used as a circuit board for a liquid crystal display device. FIG. 3 schematically shows a state wherein the circuit board having the protection cover is bent and placed on the liquid crystal display device.

A circuit board 100 and liquid crystal display device 200 are connected to each other through connection wires 300. A plurality of gate terminals and drain terminals are formed on one side of the liquid crystal display device 200, and the connection wires 300 are formed to allow exchange of signals between these terminals and the circuit board 100. The circuit board 100 is protected by a transparent plastic protection cover 120. A measurement pad 111 and circuit adjusting component 112 are formed on the circuit board 100.

Asterisk-shaped incisions 121 are formed at those positions of the protection cover 120 which correspond to the measurement pad 111 and circuit adjusting component 112 on the circuit board 100. The protection cover 120 has a sufficiently high elasticity as it is made of a plastic to a thickness of 0.3 mm to 0.5 mm. Thus, when a circuit adjusting rod 131 is inserted in one incision 121, as the circuit adjusting rod 131 moved down, that region of the protection cover 120 which is in the vicinity of the incision 121 follows the movement of the circuit adjusting rod 131 and starts to open.

When the circuit adjusting rod 131 comes into contact with the circuit adjusting component 112, adjustment of the liquid crystal display device 200 by means of the circuit adjusting rod 131 is started through the circuit board 100 and connection wire 300. When adjustment of the liquid crystal display device 200 by the circuit adjusting rod 131 is ended, the circuit adjusting rod 131 starts to separate from the circuit adjusting component 112. As the circuit adjusting rod 131 is pulled out from the incision 121, that region of the protection cover 120 which is in the vicinity of the incision 121 follows the circuit adjusting rod 131 and is closed.

When the circuit adjusting rod 131 is completely pulled out from the protection cover 120, that region of the protection cover 120 which is in the vicinity of the incision 121 is restored to the original closed state, to shield the circuit board 100 from the outside. The incision 121 in this embodiment has an asterisk shape, but an H-shaped incision 122 or U-shaped incision 123 may be used, as shown in FIG. 3.

As the material of the protection cover 120 according to this embodiment, one having the same characteristics as those of the protection cover according to the first embodiment is used. Therefore, except for the measurement and circuit adjustment times of the circuit board 100, the circuit board 100 is shielded from the outside by the protection cover 120, and dust or a foreign substance entering from the outside can be prevented.

In addition to the measurement operation using the measurement probe, the circuit board adjusting operation for adjusting the circuit adjusting component can be performed while observing the state on the circuit board 100 from the outside. When compared to a case wherein the circuit board adjusting operation is performed while the circuit board 100 can be observed only through the opening of the protection cover, the operation accuracy is improved greatly. Also, as the protection cover 120, when one in which a metal thin film is formed on the plastic surface is used, EMI radiated by the circuit board 100 to the outside can also be shielded.

The present invention is not limited to the two embodiments described above. Assume that a protection cover is formed on a circuit board to protect it from the outside, and that a probe can be inserted to reach a target probe portion on the circuit board, when necessary, through an incision in the protection cover. Such a circuit board can naturally be employed not only as a circuit board in a liquid crystal display device but also as a circuit board in any other technical field.

As has been described above, according to the present invention, when the probe is to be brought into contact with a target probe portion on a circuit board through an incision in a protection cover, the protection cover in the vicinity of the incision easily follows the motion of the probe. After the probe is pulled out from the protection cover, the protection cover in the vicinity of the incision is completely restored to the original closed state. Therefore, dust or a foreign substance conventional entering from the outside can be reduced greatly.

When a metal thin film is formed on the surface of a plastic protection cover, leakage of an electromagnetic wave from the circuit board to the outside can be prevented.

What is claimed is:

1. A circuit board protection cover, comprising:
    a box-like body for covering a circuit mounting surface of a circuit board substantially entirely, and made of an insulating material; and
    an incision selectively formed in said box-like body,
        wherein said box-like body comprises a first portion and a second portion, said first portion and said second portion on either side of said incision abut each other when closed during non-measurement of said circuit board.

2. The cover according to claim 1, wherein said incision is formed to correspond to a target probe portion on the circuit board.

3. The cover according to claim 1, wherein said incision is normally closed, and is opened when a probe is inserted in said box-like body therethrough.

4. The cover according to claim 1, wherein said incision has a shape selected from a crisscross, asterisk, H, U, and Y shapes.

5. The cover according to claim 1, wherein a region of said box-like body in a vicinity of said incision comprises at least a plastic.

6. The cover according to claim 5, wherein the plastic comprises at least one of a polyethylene terephthalate (PET) film, polycarbonate, and nylon.

7. The cover according to claim 1, wherein said box-like body comprises a plastic mold body with a surface being coated with a metal thin film.

8. The cover according to claim 7, wherein the metal thin film comprises at least one of aluminum, chromium, silver, copper, tin, and ITO (Indium Tin Oxide).

9. The cover according to claim 7, wherein the metal thin film is covered with a resin film.

10. The cover according to claim 1, wherein the protection cover is one of translucent and transparent.

11. The circuit board protection cover according to claim 1, wherein said incision is substantially closed.

12. The circuit board protection cover according to claim 1, wherein said insulating material comprises an elastic insulating material.

13. The circuit board protection cover according to claim 1, wherein said incision comprises a plurality of protection cover flexing portions, said protection cover flexing portions being displaced in a direction perpendicular to said box-like body.

14. The circuit board protection cover according to claim 13, wherein said protection cover flexing portions are positioned adjacent to said incision, to move downwardly upon pressure being applied thereto.

15. The circuit board protection cover according to claim 1, wherein said incision substantially completely shields said circuit mounting surface from a foreign substance entering said incision.

16. The circuit board protection covet according to claim 1, wherein said incision is substantially closed during said non-measurement of said circuit board.

17. The circuit board according to claim 1, wherein said box-like body includes a cover portion, and wherein said incision comprises a blow insertion portion and a cover portion,
    said blow insertion portion and said cover portion comprising an identical material.

18. The circuit board according to claim 17, wherein said blow insertion portion comprises an aperture characteristic obtained by a shape of said incision.

19. A circuit board having a protection cover, comprising:
    a board body having a circuit mounting surface;
    a box-like protection cover for covering the circuit mounting surface of said board body substantially entirely, and made of an insulating material; and
    an incision selectively formed in said protection cover,
        wherein said box-like body comprises a first portion and a second portion, said first portion and said second portion on either side of said incision abut each other when closed during non-measurement of said circuit board.

20. The circuit board according to claim 19, wherein said board body comprises at least one of a measurement pad and a circuit adjusting component one of formed and mounted on the circuit mounting surface, and
    wherein said incision is formed to correspond to one of the measurement pad and the circuit adjusting component on the circuit mounting surface.

21. The circuit board according to claim 19, wherein said incision is normally closed, and is opened when a probe is inserted in said protection cover therethrough.

22. The circuit board according to claim 19, wherein said incision has comprises a shape selected from crisscross, asterisk, H, U and Y shapes.

23. The circuit board according to claim 19, wherein a region of said protection cover in a vicinity of said incision comprises at least a plastic.

24. The circuit board according to claim 19, wherein said protection cover comprises a plastic mold body with a surface being coated with a metal thin film.

25. The circuit board according to claim 24, wherein the metal thin film is covered with a resin film.

26. The circuit board according to claim 19, wherein said protection cover is one of translucent and transparent.

27. The circuit board according to claim 19, wherein the circuit board is electrically connected to a liquid crystal display device.

28. The circuit board according to claim 19, wherein said incision comprises a plurality of protection cover flexing portions, said protection cover flexing portions being displaced in a direction perpendicular to said box-like protection cover.

29. The circuit board according to claim 19, wherein said incision is substantially closed during said non-measurement of said circuit board.

30. A circuit adjusting structure, comprising:
    a box-shaped structure for covering a circuit mounting surface of a circuit board substantially entirely, and made of an elastically insulating material; and
    an incision selectively formed in said box-shaped structure,
        wherein said box-like body comprises a first portion and a second portion, said first portion and said second portion on either side of said incision abut each other when closed during non-measurement of said circuit board.

* * * * *